United States Patent

Schlaak et al.

[11] Patent Number: 5,635,750
[45] Date of Patent: Jun. 3, 1997

[54] MICROMECHANICAL RELAY WITH TRANSVERSE SLOTS

[75] Inventors: Helmut Schlaak; Joachim Schimkat, both of Berlin, Germany

[73] Assignee: Siemens Aktiengesellschaft, Munich, Germany

[21] Appl. No.: 539,012

[22] Filed: Oct. 3, 1995

[30] Foreign Application Priority Data

Oct. 18, 1994 [DE] Germany ............................ 44 37 260.4

[51] Int. Cl.[6] .................................................. H01L 29/82
[52] U.S. Cl. ...................... 257/414; 257/415; 257/738; 257/780; 200/11 H; 200/11 G; 200/282; 200/283; 200/335; 200/559
[58] Field of Search ........................ 257/780, 735, 257/414, 415; 200/332, 335, 283, 282, 11 G, 11 H, 559, 535

[56] References Cited

U.S. PATENT DOCUMENTS

| | | | |
|---|---|---|---|
| 3,089,342 | 5/1963 | Willis | 73/514 |
| 3,950,846 | 4/1976 | Johnson | 29/630 R |
| 4,066,860 | 1/1978 | Kawasaki | 200/308 |
| 4,480,162 | 10/1984 | Greenwood | 200/181 |
| 4,654,555 | 3/1987 | Ohba et al. | 310/332 |
| 4,672,257 | 6/1987 | Oota et al. | 310/328 |
| 4,742,263 | 5/1988 | Harnden, Jr. et al. | 310/331 |
| 4,959,515 | 9/1990 | Zavracky et al. | 200/181 |
| 5,258,591 | 11/1993 | Buck | 200/181 |
| 5,334,811 | 8/1994 | Burgener et al. | 200/302.3 |
| 5,367,136 | 11/1994 | Buck | 200/600 |
| 5,376,764 | 12/1994 | Reher et al. | 200/245 |
| 5,544,001 | 8/1996 | Ichiya et al. | 361/233 |

FOREIGN PATENT DOCUMENTS

| | | |
|---|---|---|
| 28 00 343 | 1/1979 | Germany. |
| 42 05 029 C1 | 11/1993 | Germany. |
| 601 771 | 5/1976 | U.S.S.R. . |

*Primary Examiner*—William Mintel
*Attorney, Agent, or Firm*—Hill, Steadman & Simpson

[57] ABSTRACT

A micromechanical electrostatic relay has a base substrate with a base electrode and a base contact piece. The relay also has an armature substrate with an armature spring tongue that curves away from the base substrate, and an armature electrode and an armature contact piece. When a control voltage is applied between the two electrodes, the spring tongue unrolls on the base substrate and thus closes the contact. The curvature of the spring tongue in the quiescent condition is produced by a coating with a compressive strain layer. In order to avoid undesired transverse arcs of the spring tongue, the compressive strain layer is subdivided into strips by slots in a longitudinal direction of the spring tongue. A tensile stress layer applied in surface-wide fashion over the strips and slots reinforces the compensation effect.

10 Claims, 4 Drawing Sheets

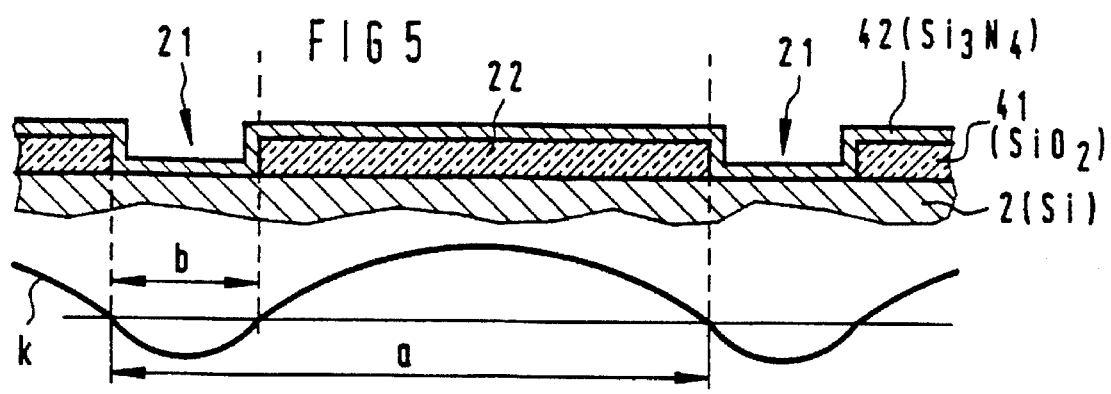
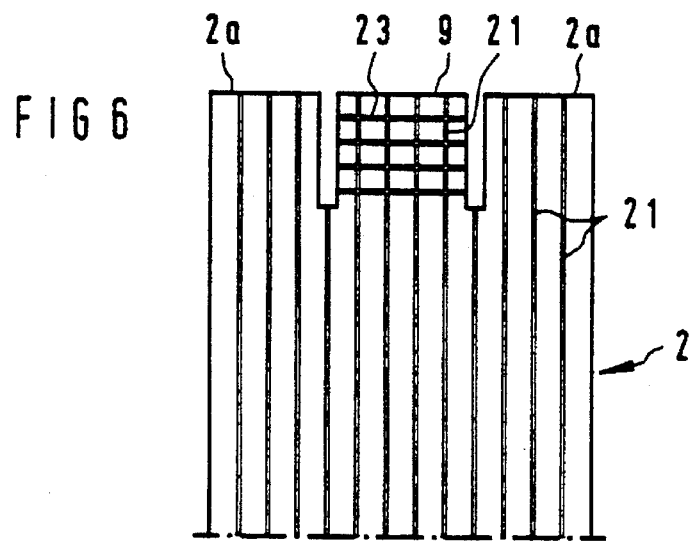
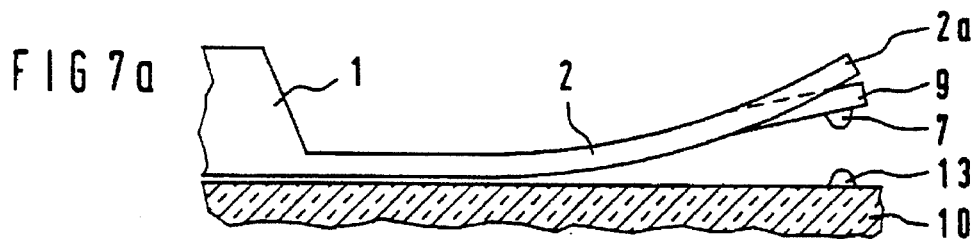
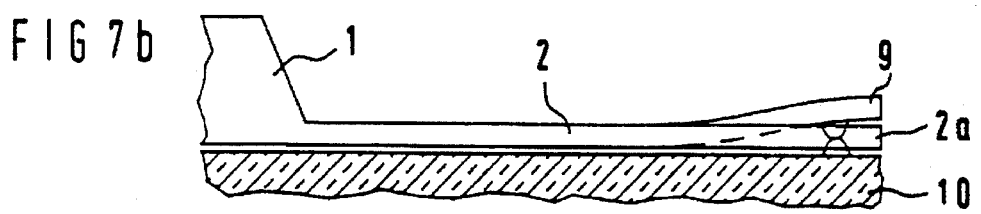

MICROMECHANICAL RELAY WITH TRANSVERSE SLOTS

RELATED APPLICATIONS

The present application is related to copending application Hill Firm Case No. P95,2359-"MICROMECHANICAL RELAY" U.S. patent application Ser. No. 08/538,367 filed Oct. 3, 1995 and Hill Firm Case No. P95,2360-"MICROMECHANICAL ELECTROSTATIC RELAY" U.S. patent application Ser. No. 08/538,440, filed Oct. 3, 1995.

BACKGROUND OF THE INVENTION

The invention is directed to a micromechanical electrostatic relay having a base substrate that carries a base electrode layer and a base contact piece, and having an armature substrate that lies on the base substrate and has an armature spring tongue that is worked free and attached at one side and that carries an armature electrode layer and an armature contact piece at its free end. The spring tongue carries at least one layer that generates a mechanical stress relative to its substrate material such that the spring tongue is bent away from the base substrate by a steady curvature in the quiescent condition and conforms to the base substrate in the working condition when a voltage is present between the electrode layers, whereby the two contact pieces lie against one another DE 42 05 029 C1 already discloses such a micromechanical relay. As set forth therein, such a relay structure can be manufactured, for example, of a crystalline semiconductor substrate, preferably silicon, whereby the spring tongue serving as an armature is worked out of the semiconductor substrate by appropriate doping and etching processes. By applying a control voltage between the armature electrode of the spring tongue and the planar base electrode, the curved spring tongue rolls on the base electrode and thus forms what is referred to as a migrating wedge. The spring tongue is stretched during this rolling until the free end with the armature contact piece touches the base contact piece on the base substrate.

It is likewise already mentioned in general form in the above-recited publication that stresses can be generated in the spring tongue by specific, additional layers such as $SiO_2$ and $Si_3N_4$, the desired curvature in the quiescent condition being thereby achieved. This preferably occurs in that a layer that produces a compressive strain relative to the substrate material is applied on that side of the spring tongue facing toward the base electrode, the spring tongue uniformly curving away from the base substrate as a result thereof.

The coating with a stress-generating material, however, results in the fact that the stress forces act not only in one direction but toward all sides, so that the spring tongue is given not only the desired curvature in the longitudinal direction, but is also usually given an undesirable arc in the transverse direction. Given a spring tongue that carries the contact piece in the middle region of its free end, this means that the tabs of the spring tongue situated at both sides of the contact piece arc further upward away from the base substrate than the contact region. Without enlarging the contact spacing, the working air gap between the electrodes is thus enlarged in this region, the response voltage consequently also undesirably rising.

SUMMARY OF THE INVENTION

An object of the present invention is to design the spring tongue of a relay of the type initially cited such that undesirable transverse arcs are avoided and such that curvature regions can generally be set section-by-section such that an optimum switch characteristic arises.

This object is achieved according to the invention in that the layer on the spring tongue that generates the mechanical stress is respectively subdivided into strips by parallel slots that proceed transversely relative to an undesired curvature direction.

For a preferred embodiment wherein the spring tongue comprises a layer, for example of $SiO_2$, producing a compressive strain on that side facing toward the base substrate, this means that slots proceeding in the longitudinal direction of the spring tongue are provided in order to achieve the longitudinal curvature of the spring tongue and avoid a transverse arc. It can thereby also be advantageous that the spring tongue carries an additional layer, preferably $Si_3N_4$, that generates a tensile stress on that side facing toward the base substrate, the thickness thereof being substantially less than that of the layer for producing compressive strain. The additional layer also coating the slots without interruption.

It is also desirable under certain circumstances that the curvature of the spring tongue is only obtained over a certain region; but other regions, for instance the section that carries the contact piece, are as flat as possible. In this case, a development of the invention provides that the layer that generates the mechanical stress is subdivided in checkerboard like fashion by a grid of slots perpendicular to one another. Given an especially dense arrangement of slots transverse to the longitudinal direction of the spring tongue, a curvature opposite the principal curvature direction of the spring tongue can thereby be produced with the assistance of the second layer that generates a tensile stress.

BRIEF DESCRIPTION OF THE DRAWINGS

FIG. 5 is a spring tongue section in cros-section for illustrating individual slots in the layer system;

FIG. 6 is a spring tongue in plan view with a schematically illustrated slot structure;

FIGS. 7a and 7b are the spring tongue of FIG. 6 in the quiescent condition and in the working condition, shown in a side view;

DESCRIPTION OF THE PREFERRED EMBODIMENTS

Figure 1:
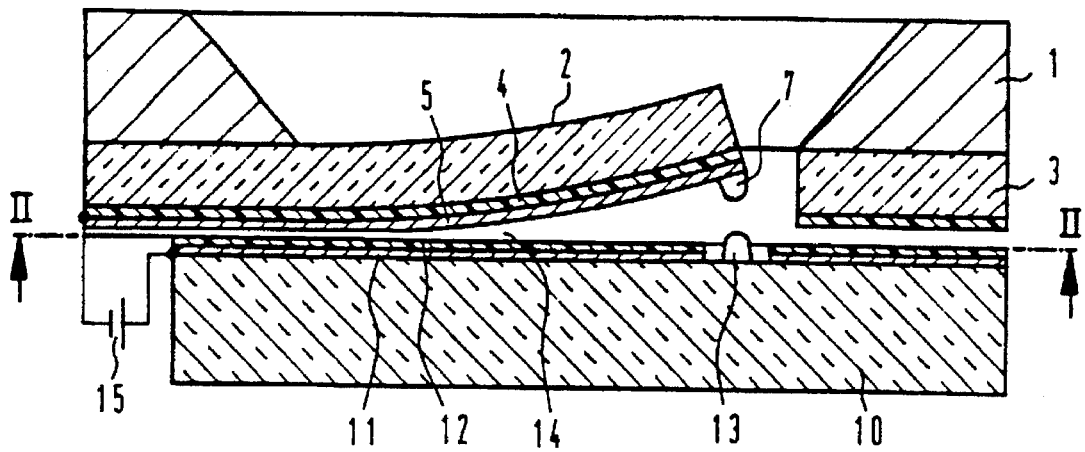
FIG. 1 is a schematic illustration of the basic structure of a micromechanical relay with a curved armature spring tongue, shown in section.

FIG. 1 schematically shows the basic structure of a micromechanical electrostatic relay wherein the invention is applied. At an armature substrate, preferably a silicon wafer, an armature spring tongue 2 is worked free with selective etching processes within a corresponding doped silicon layer. A double layer 4 is produced at the underside of the spring tongue, this double layer 4 being composed, in the example, of a $SiO_2$ layer that produces compressive strains, and of a $Si_3N_4$ layer that produces tensile stresses; this shall be discussed in yet greater detail with reference to FIG. 3. The spring tongue can be given a desired curvature with an appropriate selection of the layer thicknesses. Finally, the spring tongue carries a metallic layer as an armature electrode 5 at its underside. This armature electrode 5, as may be seen from FIG. 2, is divided in two in order to form a metallic lead 6 for the armature contact piece 7 in the middle of the spring tongue.

Figure 2:
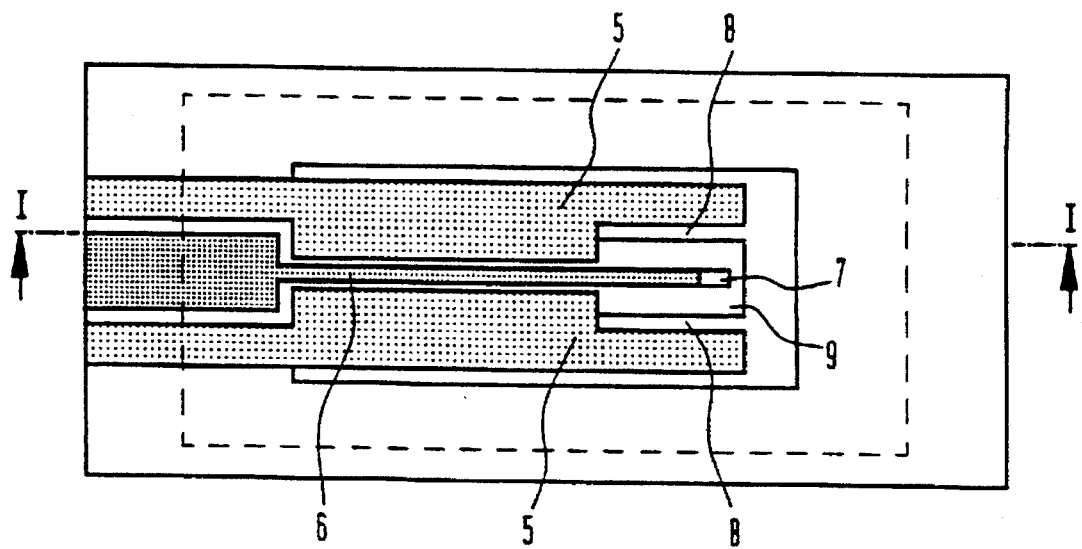
FIG. 2 is a view from below onto a spring tongue having a contact spring section delimited by slots in a known way.

As may be seen further from FIG. 2, a contact spring region or section 9 that carries the contact piece 7, is cut free by two slots 8 at the free end of the spring tongue. When the armature electrode 5 lies fiat against a base electrode, this contact spring section 9 can bend elastically, the contacting force being generated as a result thereof.

As may be seen further from FIG. 1, the armature substrate 1 is secured on a base substrate 10 that is composed of pyrex glass in the present example but that, for example, could also be composed of silicon. On its planar surface, the base substrate 10 carries a base electrode 11 and an insulating layer 12 in order to insulate the base electrode 11 from the armature electrode 5. In a way not shown in detail, a base contact piece 13 is provided with a lead and, of course, is arranged in insulated fashion from the base electrode 11. A wedge-shaped air gap 14 is formed between the curved spring tongue 2 with the armature electrode, on the one hand, and the base electrode, on the other hand. When a voltage from a voltage source 15 is present between the two electrodes 5 and 11, the spring tongue unrolls on the base electrode 11, as a result of which the armature contact piece 7 is connected to the base contact piece 13. The size relationships and layer thicknesses are shown only from the point of view of clarity and do not correspond to the actual conditions.

A micromechanically produced spring tongue according to FIG. 1, which comprises a curvature without excitation in the quiescent condition, must be prestressed by a suitable layer system. This can be achieved in that the side facing toward the base electrode comprises a compressive strain compared to the back side of the tongue. Deformations of Si tongues can be produced since a prestressed layer system is applied on the Si wafer surface. Such prestresses arise by freezing in thermal expansions in the manufacturing process. For example, a $SiO_2$ layer is produced by thermal oxidation of silicon at about 1100° C. $SiO_2$ has a lower coefficient of thermal expansion than Si, so that the $SiO_2$ layer is under compressive strain compared to the Si substrate during cooling, and this effects a uniformly curved deformation into the armature substrate, given a tongue that has been etched free. $Si_3N_4$ layers, on the other hand, produce tensile stresses relative to the Si substrate since their coefficient of thermal expansion is higher than that of Si. The curvature can be arbitrarily set merely by selecting the two layer thicknesses based on the combination of a $SiO_2$ layer and a $Si_3N_4$ layer.

Figure 3:
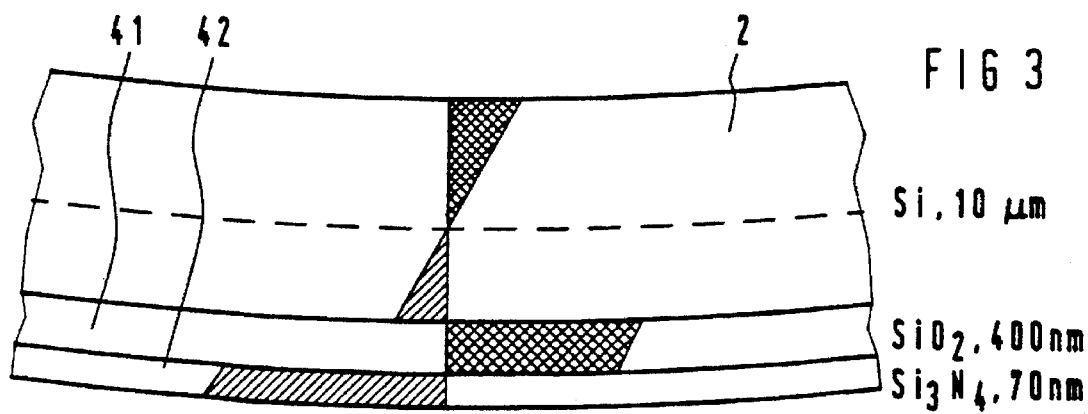
FIG. 3 is a schematic illustration of the tension states in a layer system of a spring tongue.

FIG. 3 shows such a layer system by way of example. A $Si_2$ layer of about 400 nm [thickness] is thereby applied on a silicon tongue having a thickness of about 10 μm, and a $Si_3N_4$ layer of about 70 nm thickness is in turn applied on this $Si_2$ layer. The layer thicknesses can be exactly observed to 1 to 2% in the manufacture. Computer simulations with the FEM (finite element method) showed a deviation of the aperture of about 0.1 μm, which corresponds to an error of about 1%. Such a layer system can thus also be governed on a large scale. In FIG. 3, the compressive strain prevailing in the $SiO_2$ layer is indicated by a cross hatching, whereas the tensile stress prevailing in the $Si_3N_4$ layer is indicated with a simple shading. Since the $SiO_2$ layer is significantly thicker than the $Si_3N_4$ layer, and upward bending of the tongue results overall, whereby regions with tensile stresses and compressive strains in turn occur within the Si tongue as both sides of a neutral zone.

Figure 4:
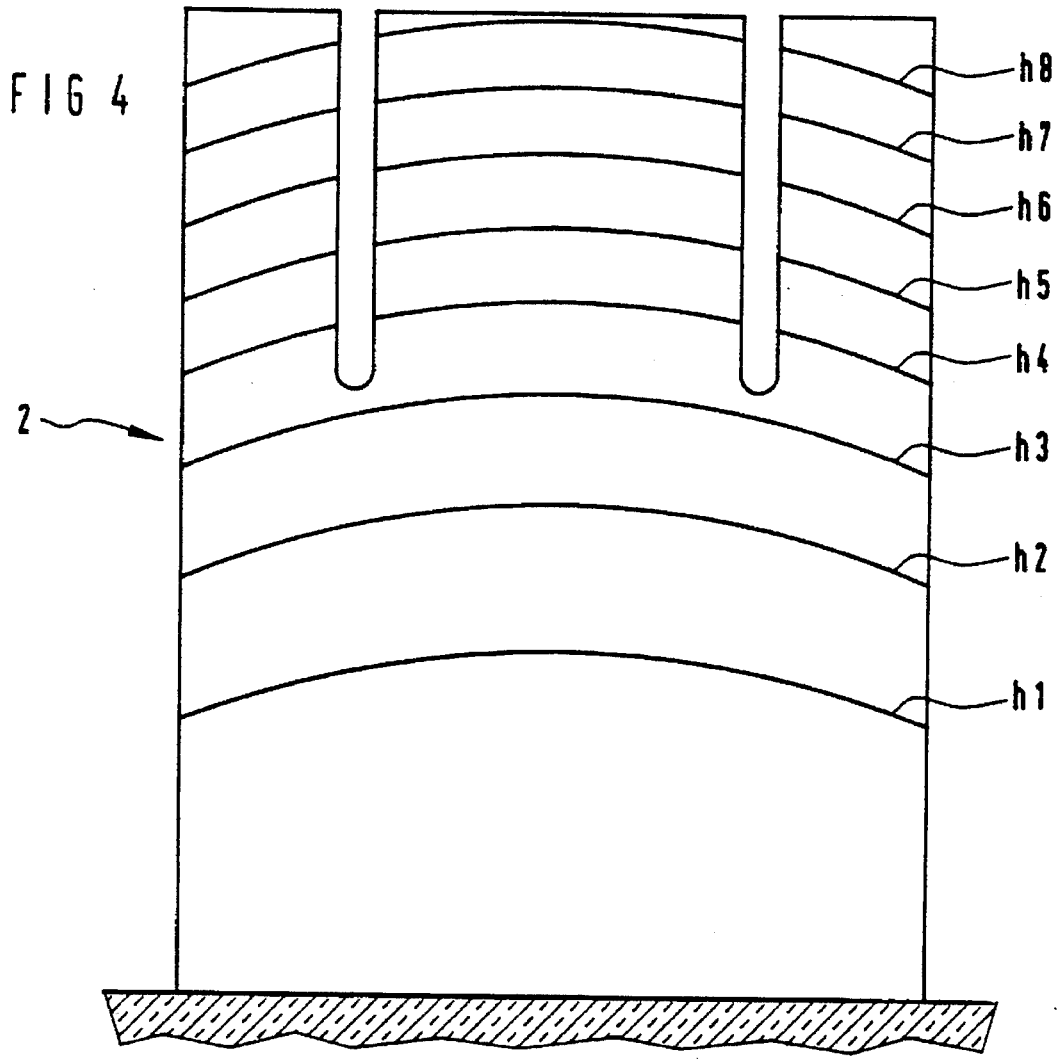
FIG. 4 is a plan view onto a spring tongue according to FIG. 2 with contour lines entered therein for illustrating the arc in the quiescent condition produced given a uniform coating.

In a spring tongue of FIG. 1, such a layer structure with continuous layers then effects an arcing around two axes, this being shown in FIG. 4. The spring tongue 2 is shown in plan view here, whereby the upward arc from the base plane of the armature substrate is illustrated here with individual contour lines h1 through h8. Each contour line corresponds to a specific deformation value or spacing from the base surface. Given a spring tongue having a length of 1300 μm and a width of 1000 μm with the afore-mentioned layer structure, the simulation yielded, for example, a spacing of 1.2 μm from the base surface for the contour line h1 and a spacing of 9.3 μm from the base surface for the contour line h8, so that a spacing of approximately 11 μm arises at the spring end. The contour lines also do not proceed straight, but are curved, this meaning that the spring tongue is curved not only in its longitudinal direction but also comprises an arc in the transverse direction. This has the disadvantages that were already initially mentioned, for which reason the invention strives to avoid such transverse arcs.

FIG. 5 schematically shows a crossection through the spring tongue having the layer structure of FIG. 3. However, respective longitudinal slots 21 with the width b are thereby introduced with the spacing a, whereas the $Si_3N_4$ layer also proceeds continuously over the slots. For example, the slot width can amount to 2 μm. The course k of the curvature is also indicated in FIG. 5 under the tongue. One can see that the inwardly directed arc due to the compressive strain of the $SiO_2$ layer is now limited to the width of the strip 22 between the slots 21, whereby an oppositely directed arc of the tongue is effected in the slots due to the tensile stress of the $Si_3N_4$ layer. Overall, the tongue is thus given a somewhat wavy, but nonetheless straight, path overall in the transverse direction. The compensation of the transverse arc can be set as desired on the basis of a corresponding selection of the plurality of slots 21 or of the width of the strips 22.

In a plan view, FIG. 6 schematically shows a spring tongue having longitudinal slots 21 according to FIG. 5. The longitudinal slots are conducted over the entire length of the spring tongue 2, including the lateral tabs 2a at the free end. For better alignment of the contact piece, however, it is desirable for the contact spring region 9 between the two lateral tabs 2a that this region be flat; since it does not carry an electrode surface or area, it also contributes nothing to the electrostatic attraction. In addition to being provided with the longitudinal slots 21, this region 9 is therefore also provided with transverse slots, as a result of which a practically flat contact spring region is produced given an appropriate dimensioning. FIGS. 7a and 7b show such a spring tongue according to FIG. 6 in a side view, namely in the non-excited quiescent condition (FIG. 7a) and in the attracted condition (FIG. 7b).

Figure 8:
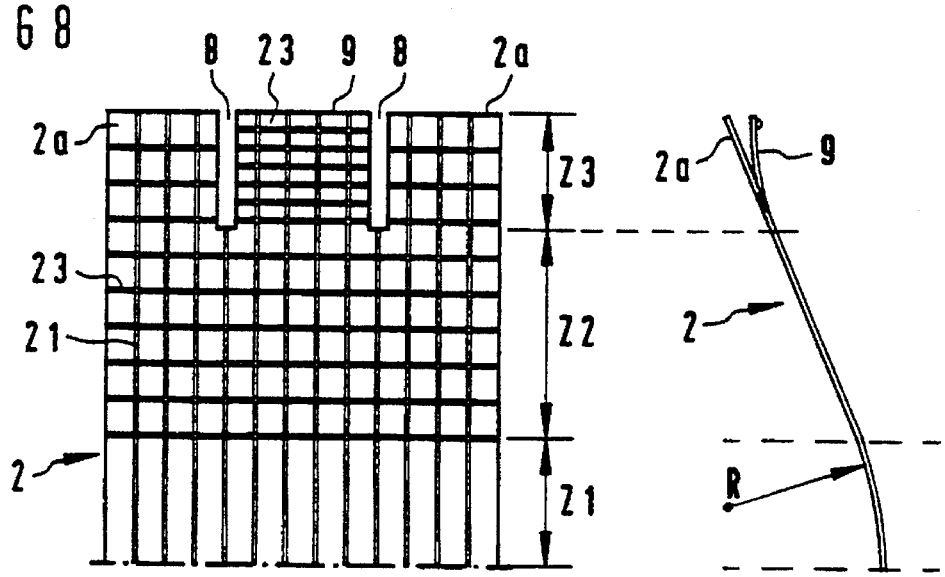
FIG. 8 a further example of a spring tongue with a modified slot structure, shown in plan view and a schematic side view.

For an optimum switch characteristic with respect to the trip conditions when closing and opening the relay, i.e., for example, in order to avoid contact creeping, a switch tongue is desirable that comprises a curvature over only a part of its length and is flat in its remaining area. Since the layer deposition occurs uniformly over the entire silicon wafer, layer thicknesses that vary section-by-section are difficult to produce. A variation of the curvature over various regions cannot be produced by the inventive technique. FIG. 8 thus shows a spring tongue 2 in plan view and in a schematic side view, whereby three different sections are differently slotted and, accordingly, also comprise different curvatures. A first region Z1 adjoining the attachment of the spring tongue 2 carries slots 21 only in the longitudinal direction; accordingly, this region is curved in the longitudinal direction with the radius R. The region Z2 carries longitudinal slots 21 and transverse slots 23, as a result whereof this region of the spring tongue is kept essentially flat. The end region Z3, finally, is subdivided by the spring tongue slots 8 into the lateral tabs 2a and into the contact spring region 9. The lateral tabs 2a carry longitudinal and transverse slots like the region Z2. The contact spring region 9 likewise carries longitudinal slots 21 and transverse slots 23. In this case, however, the transverse slots 23 are arranged so close to one another that a curvature opposite the curvature of the region Z1 results for this section; this means that the contact spring section is curved toward the base contact piece.

Figure 9:
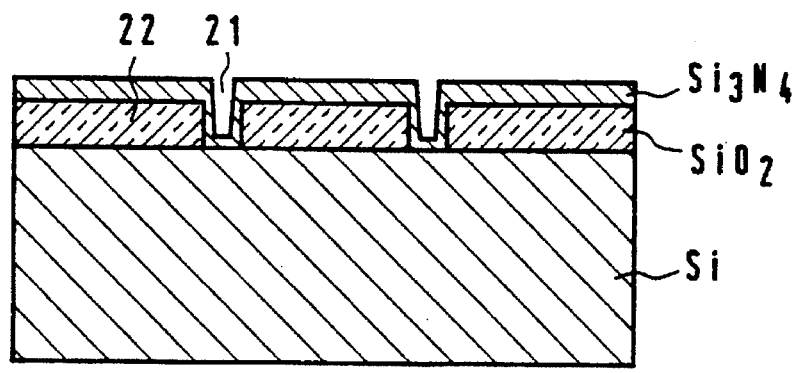
FIGS. 9 and 10 are two exemplary embodiments of the design of the slot structure, shown in a cros-sectional view.

The fabrication-oriented production of the slots in the compressive strain layer can occur according to FIG. 9 in that the slot structures are etched out of a surface-wide $SiO_2$ layer with the assistance of a lithography step and the $Si_3N_4$ layer is in turn applied in surface-wide fashion, for example with vapor phase deposition.

Figure 10:
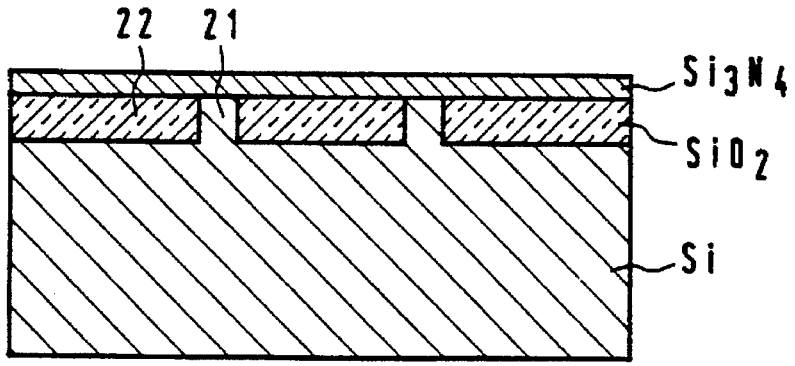

FIG. 10 shows another possibility. Here, the oxidation is already topically limited in that a corresponding marking layer (for example, $Si_3N_4$) is previously applied, so that the $SiO_2$ layer already arises in strip or stripe form. The $Si_3N_4$ is subsequently again applied over the entire surface. Instead of the $SiO_2$ layer, a doping of the silicon that generates compressive strains can also occur. Subsequently, the $Si_3N_4$ layer is again deposited in surface-wide fashion. The advantage of this method is comprised in the smooth surface topography.

Although various minor changes and modifications might be proposed by those skilled in the art, it will be understood that our wish is to include within the claims of the patent warranted hereon all such changes and modifications as reasonably come within our contribution to the art.

We claim as our invention:

1. A micromechanical electrostatic relay, comprising:

a base substrate having a base electrode layer and a base contact piece thereon;

an armature substrate overlying the base substrate and having an armature spring tongue which is worked free from and integrally attached at one end to the armature substrate and which is free to move at its opposite free end, said armature spring tongue having an armature electrode layer thereon and also an armature contact piece at said free end;

said armature spring tongue having at least one layer thereon for generating a mechanical stress relative to a material of the armature substrate forming the armature spring tongue so that the spring tongue is bent away from said base substrate by a steady curvature in a quiescent condition, and conforms to the base substrate in a working condition when a voltage is present between the base electrode layer and the armature electrode layer such that the base contact piece and said armature contact piece lie against one another; and said at least one layer generating said mechanical stress on the spring tongue being subdivided into strips by parallel slots proceeding transversely relative to an undesired curvature direction.

2. A relay according to claim 1 wherein said at least one layer for generating a mechanical stress comprises a double layer formed of first and second layers, the first layer producing a compressive strain on the side facing toward said base substrate, said first layer being subdivided into strips by slots in a longitudinal direction of the spring tongue.

3. A relay according to claim 2 wherein said first layer comprises $SiO_2$.

4. A relay according to claim 2 wherein said second layer of said double layer produces a tensile stress on a side facing toward said base substrate, a thickness of said second layer being significantly less than a thickness of said second layer which is a compressive strain layer, and said second layer also covering said slots without interruption.

5. A relay according to claim 4 wherein said second layer comprises $Si_3N_4$.

6. A relay according to claim 2 wherein said first layer of said double layer is subdivided in checkerboard-like fashion by a grid of slots perpendicular to one another in order to achieve planar regions.

7. A relay according to claim 6 wherein a region curved opposite a principle curvature direction is produced by a dense arrangement of slots transversely to said longitudinal direction of said spring tongue.

8. A relay according to claim 2 wherein said first layer which is a stress producing layer is applied in strip-shaped fashion on said armature substrate, and said slot between said strips being filled by webs of said armature substrate.

9. A relay according to claim 2 wherein said slots subdividing said first layer which is a stress producing layer being designed as depressions between said remaining strips of said first layer, and a further layer for producing a counter-stress extending into said depressions.

10. A micromechanical electrostatic relay, comprising:

a base substrate having a base electrode layer and a base contact piece thereon;

an armature substrate on the base substrate and having an armature spring tongue which is integrally attached at one end to the armature substrate and which is free to move at its opposite free end, said armature spring tongue having an armature electrode layer thereon and also an armature contact piece at said free end;

said armature spring tongue having at least one layer thereon for generating a mechanical stress relative to a material of the armature substrate forming the armature spring tongue so that the spring tongue is bent away from said base substrate by a steady curvature in a quiescent condition and conforms to the base substrate in a working condition when a voltage is present between the base electrode layer and the armature electrode layer such that the base contact piece and said armature contact piece lie against one another; and said at least one layer generating said mechanical stress on the spring tongue being subdivided into strips by parallel slots proceeding transversely relative to an undesired curvature direction and running toward said free end.

* * * * *